United States Patent
Dezelah et al.

(10) Patent No.: US 12,234,548 B2
(45) Date of Patent: Feb. 25, 2025

(54) METHODS OF FORMING COPPER IODIDE LAYER AND STRUCTURES INCLUDING COPPER IODIDE LAYER

(71) Applicant: ASM IP Holding B.V., Almere (NL)

(72) Inventors: Charles Dezelah, Helsinki (FI); Andrea Illiberi, Leuven (BE); Varun Sharma, Helsinki (FI); Bart Vermeulen, Helsinki (FI); Michael Givens, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 106 days.

(21) Appl. No.: 18/103,594

(22) Filed: Jan. 31, 2023

(65) Prior Publication Data

US 2023/0243032 A1   Aug. 3, 2023

Related U.S. Application Data (60) Provisional application No. 63/306,230, filed on Feb. 3, 2022.

(51) Int. Cl.
  *C23C 16/30*   (2006.01)
  *C23C 16/455*  (2006.01)
  *C23C 16/56*   (2006.01)

(52) U.S. Cl.
  CPC ........ *C23C 16/30* (2013.01); *C23C 16/45553* (2013.01); *C23C 16/56* (2013.01)

(58) Field of Classification Search
  CPC ..... C23C 16/0272; C23C 16/30; C23C 16/56; C23C 16/45525; C23C 16/45553
  See application file for complete search history.

(56) References Cited

U.S. PATENT DOCUMENTS

| | | | |
|---|---|---|---|
| 6,869,876 B2 * | 3/2005 | Norman | H01L 21/76862 257/E21.171 |
| 2004/0087143 A1 | 5/2004 | Norman | |
| 2014/0234550 A1 * | 8/2014 | Winter | C23C 16/18 427/535 |
| 2022/0380893 A1 * | 12/2022 | Chang | C23C 16/0272 |

FOREIGN PATENT DOCUMENTS

WO   WO-2021232577 A1 * 11/2021

OTHER PUBLICATIONS

Machine translation of WO2021232577A1. (Year: 2021).*

* cited by examiner

*Primary Examiner* — Michael P Wieczorek
(74) *Attorney, Agent, or Firm* — Snell & Wilmer L.L.P.

(57) ABSTRACT

A method and system for forming a copper iodide layer on a surface of a substrate are disclosed. Exemplary methods include using a cyclic deposition process that includes providing a copper precursor to a reaction chamber and providing an iodine reactant to the reaction chamber. Exemplary methods can further include providing a reducing agent and/or providing a dopant reactant to the reaction chamber. Structures formed using the method are also described. The structures can be used to form devices, such as memory devices.

18 Claims, 5 Drawing Sheets

METHODS OF FORMING COPPER IODIDE LAYER AND STRUCTURES INCLUDING COPPER IODIDE LAYER

CROSS-REFERENCE TO RELATED APPLICATIONS

This application claims priority to U.S. Provisional Patent Application Ser. No. 63/306,230, filed Feb. 3, 2022, and titled METHODS OF FORMING COPPER IODIDE LAYER AND STRUCTURES INCLUDING COPPER IODIDE LAYER, the disclosure of which is hereby incorporated by reference in its entirety.

FIELD OF DISCLOSURE

The present disclosure generally relates to gas-phase deposition methods and structures formed using such methods. More particularly, the disclosure relates to methods for depositing layers comprising copper iodide and to structures including such layers.

BACKGROUND OF THE DISCLOSURE

Transparent semiconducting material that exhibits a relatively wide bandgap may be desirable for a variety of applications. For example, such material can be used in the manufacture of electronic devices, such as memory devices and other thin-film transistor devices suitable for use in electronic devices.

N-type metal oxide thin films, such as indium gallium zinc oxide (IGZO) and indium tin oxide (ITO), have been proposed for dynamic random access memory (DRAM), flash memory, and ferroelectric memory, due to their wide bandgap and relative high carrier mobility. However, the development of p-type metal oxide materials, such as tin oxide (SnO) and copper oxide ($Cu_2O$), has thus far been limited by poor hole mobility and/or relatively poor transparency of such materials. Accordingly, improved transparent semiconducting material with a relatively wide bandgap (e.g., greater than 2.5 eV) suitable for p-type semiconducting material is desirable. Additionally, methods of depositing layers of such material are also desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of forming a copper iodide layer on a surface of a substrate. As set forth in more detail below, layers including copper iodide are thought to be suitable for p-type transparent wide bandgap semiconducting materials that can be used in a variety of electronic devices, such as memory (e.g., DRAM) devices and the like.

In accordance with examples of the disclosure, a method of forming a copper iodide layer on a surface of a substrate is provided. An exemplary method includes providing a substrate within a reaction chamber, providing a copper precursor to the reaction chamber, providing a reducing agent to the reaction chamber, and providing an iodine reactant to the reaction chamber. The method can further include providing a dopant reactant to the reaction chamber. In some cases, the step of providing the dopant reactant and the step of providing the iodine reactant can overlap. In some cases, the reducing agent can be or include a dopant.

In accordance with further examples of the disclosure, a method of forming a doped copper iodide layer on a surface of a substrate includes providing a substrate within a reaction chamber, providing a copper precursor to the reaction chamber, providing a dopant reactant to the reaction chamber, and providing an iodine reactant to the reaction chamber. In some cases, the step of providing the dopant reactant and the step of providing the iodine reactant can overlap.

In accordance with additional examples of the disclosure, a method of forming a structure comprising a copper iodide layer includes providing a substrate within a reaction chamber, providing a copper precursor to the reaction chamber, providing an iodine reactant to the reaction chamber to form the copper iodide layer, and forming a material layer overlying the copper iodide layer. In accordance with these examples, the iodine reactant can be selected from the group consisting of: a diiodo compound, such as diiodoalkane, including 1,2-diiodoalkanes and 1,1-diiodoalkanes and a C1-C10 hydrocarbon bearing one iodo substituent or other (e.g., organic or metal) iodine reactant noted herein. In some embodiments, the iodine reactant comprises a C1-C6 1,1-diiodo substituted hydrocarbon, a C2-C6 1,2-diiodo substituted hydrocarbon, such as diiodomethane. In some embodiments, the iodine reactant comprises 2-iodotoluene. A method according to these examples can further include a step of providing a reducing agent to the reaction chamber. Additionally or alternatively, the method can include a step of providing a dopant reactant to the reaction chamber.

In accordance with yet further examples of the disclosure, a structure is provided. Exemplary structures include a substrate and a copper iodide layer formed overlying the substrate. The copper iodide layer can be formed according to a method described herein. Further, the copper iodide layer can be a p-type semiconducting layer. Exemplary structures can further include a material layer overlying the copper iodide layer. The structures can be suitable for a variety of applications, such as the formation of memory (e.g., DRAM) devices.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

Examples of the present disclosure provide improved methods and systems for forming a copper iodide layer on a surface of a substrate and improved structures including a copper iodide layer. The methods and systems can be used to form structures suitable for use in the manufacture of electronic devices, such as memory (e.g., DRAM) devices.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas. Exemplary seal gases include noble gases, nitrogen, and the like. In some cases, the term "precursor" can refer to a compound that participates in the chemical reaction that produces another compound, and particularly to a compound that constitutes a film matrix or a main skeleton of a film; the term "reactant" can be used interchangeably with the term precursor. In some cases, a reactant reacts with a precursor or derivative thereof to form a film or layer.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate and/or may be or may become embedded in a substrate. A film or layer may comprise material or a layer with pinholes and/or isolated islands. A film or layer may be at least partially continuous.

As used herein, a "copper iodide layer" can refer to a film or layer than includes copper and iodide. A copper iodide layer can include one or more dopants. In some cases, a copper iodide layer can include trace amounts of other elements as impurities—e.g., less than 0.1 atomic percent (at. %), less than about 2 at. %, less than about 5 at. % or less than 10 at. %, such as from about 0.05 at. % to about 9 at. %, or from about 0.5 at. % to about 6 at. % of carbon, hydrogen, or the like.

As used herein, a "structure" can be or can include a substrate as described herein. Structures can include one or more layers overlying the substrate, such as one or more layers formed according to a method as described herein.

The term "deposition process" as used herein can refer to the introduction of precursors (and/or reactants) into a reaction chamber to deposit or form a layer over a substrate. "Cyclical deposition processes" are examples of "deposition processes."

The term "cyclic deposition process" or "cyclical deposition process" can refer to the sequential introduction of precursors (and/or reactants) into a reaction chamber to deposit a layer over a substrate and includes processing techniques, such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor processes performed with alternating pulses of precursor(s)/reactive gas(es), and purge (e.g., inert carrier) gas(es).

Generally, for ALD processes, during each cycle, a precursor is introduced into a reaction chamber and is chemisorbed onto a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., a reactant or reaction gas) may subsequently be introduced into the process chamber for use in converting the chemisorbed precursor to a desired material or an intermediate material on the substrate surface. The reactant can be capable of further reaction with the precursor. Additional reactants can be used to react with species on the substrate surface. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reaction chamber in between two pulses of gases that react with each other. For example, a purge, e.g., using a noble gas, may be provided between a precursor pulse and a reactant pulse, thus avoiding or at least reducing gas phase interactions between the precursor and the reactant. It shall be understood that a purge can be effected either in time or in space, or both. For example, in the case of temporal purges, a purge step can be used, e.g., in the temporal sequence of providing a first precursor to a reaction chamber, providing a purge gas to the reaction chamber, and providing a reactant to the reaction chamber, wherein the substrate on which a layer is deposited does not move. For example, in the case of spatial purges, a purge step can take the following form: moving a substrate from a first location to which a first precursor is continually supplied, through a purge gas curtain, to a second location to which a reactant is continually supplied.

As used herein, a "precursor" includes a gas or a material that can become gaseous and that can be represented by a chemical formula that includes an element which may be incorporated during a deposition process as described herein. A "copper precursor" includes copper and one or more ligands or functional groups as described in more detail below.

The term "iodine reactant" can refer to a gas or a material that can become gaseous and that can be represented by a chemical formula that includes iodine. As set forth in more detail below, exemplary iodine reactants can include one or more ligands or functional groups.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like.

As used herein, the term "comprising" or "including" indicates that certain features are included, but that it does not exclude the presence of other features, as long as they do not render the claim or embodiment unworkable. In some embodiments, the term "comprising" or "including" includes "consisting of" or "consisting essentially of." As used herein, the term "consisting of" indicates that no further features are present in the apparatus/method/product apart from the ones following said wording. When the term "consisting of" is used, referring to a chemical compound, it indicates that the chemical compound only contains the components which are listed.

In this disclosure, any defined meanings do not necessarily exclude ordinary and customary meanings in some embodiments.

As noted above, improved methods of forming a copper iodide layer on a surface of a substrate are provided herein. The copper iodide layer can be used as a p-type semiconducting layer with a relatively wide bandgap (e.g., greater than 3.0 eV or between about 2.7 eV and about 3.6 eV, such as between about 2.8 eV and about 3.5 eV, such as about 3.1 eV, and/or with a relatively high transparency in the visible light spectrum—e.g., greater than about 45% or about 50% or about 50% to about 85% for light wavelengths in the visible light spectrum. Without limiting the current disclosure to any specific theory, the inventors have contemplated that CuI could possess better overlap between the Cu 3$d$ and the I 5$p$ orbitals than found in copper oxide and provide improved mobility, compared to copper oxide and other metal oxide semiconducting materials. Additionally, dopants such as zinc (Zn), tin (Sn) and/or cobalt (Co) may also act to further improve switching performance between on/off states of devices, including copper iodide layers as described herein.

Figure 1:
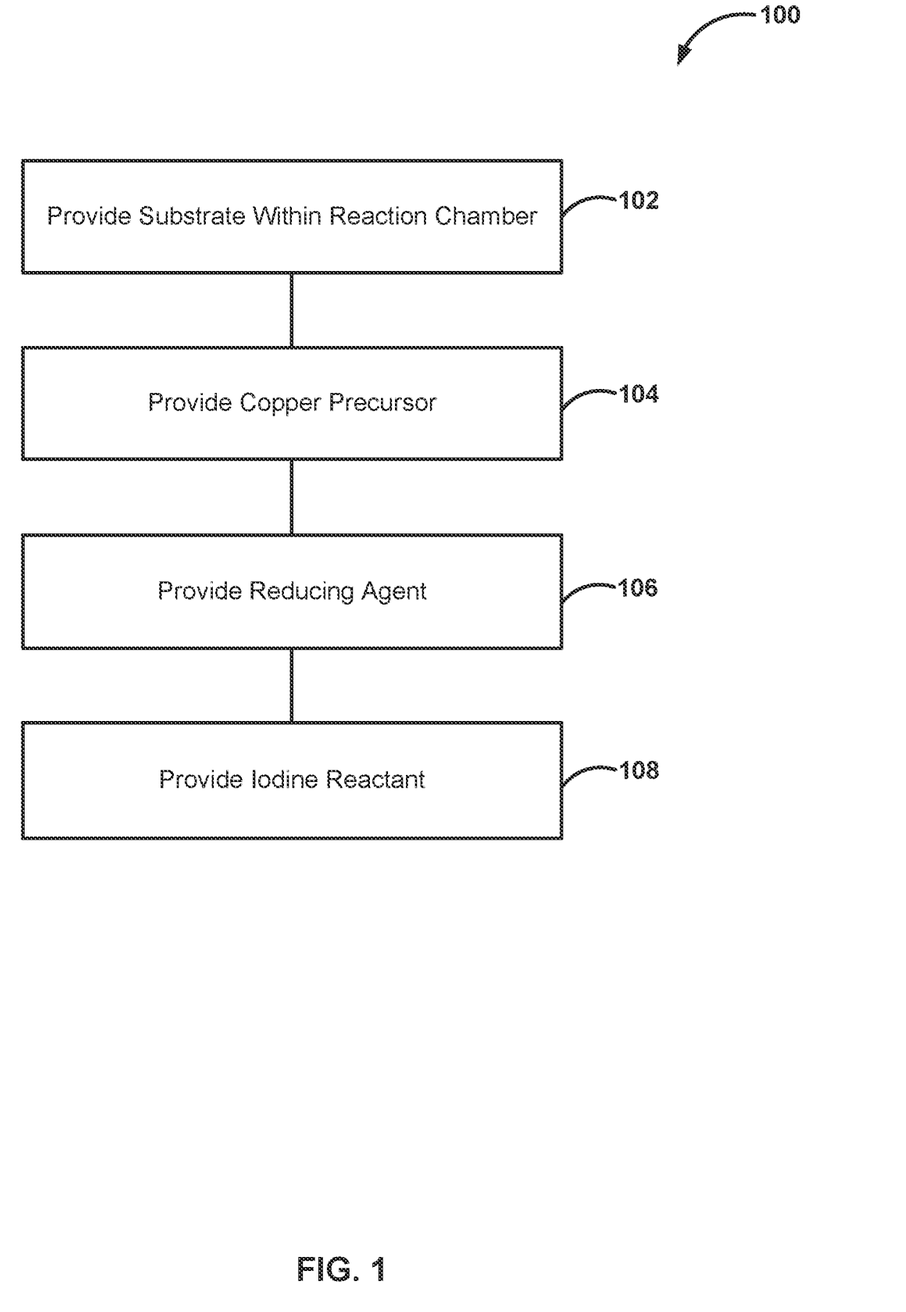
FIG. 1 illustrates a method in accordance with examples of the disclosure.

Turning now to the figures, FIG. 1 illustrates a method 100 in accordance with examples of the disclosure. Method 100 includes the step of providing a substrate within a reaction chamber (step 102); providing a copper precursor to the reaction chamber (step 104); providing a reducing agent to the reaction chamber (step 106); and providing an iodine reactant to the reaction chamber (step 108). Although separately illustrated, some steps of method 100 can be combined or can overlap. As used herein, overlap means performed within the same reaction chamber for a period of time. Further, as described in more detail below, in some cases, method 100 can include additional steps, such as providing one or more dopant reactants to the reaction chamber. Method 100 can be a cyclic—e.g., ALD or cyclical CVD method or hybrid cyclical CVD process.

Steps of method 100 can be performed within a single reactor system—e.g., within a reaction chamber of a single reactor system or cluster tool or process module. An exemplary reactor system is described in more detail below in connection with FIG. 5.

During step 102, a substrate is provided into a reaction chamber of a reactor system. In accordance with examples of the disclosure, the reaction chamber forms part of a gas-phase reactor, such as a cyclical deposition reactor, such as an atomic layer deposition (ALD) reactor, a CVD reactor, or the like. Optionally, a reactor including the reaction chamber can be provided with a heater to activate the reactions by elevating the temperature of one or more of the substrate, the reaction chamber wall, and/or the reactants/precursors.

During step 102, the substrate can be brought to a desired temperature and pressure for steps 104-108. While the specific temperatures and pressures can depend on the precursor and/or reactant(s), by way of examples, a temperature (e.g., of a substrate or a substrate support) within a reaction chamber can be between about 80° C. and about 400° C. or between about 100° C. and about 300° C.; a pressure within the reaction chamber can be about 0.1 Torr to about 50 Torr or about 1 Torr to about 20 Torr.

During step 104, a copper precursor is provided to the reaction chamber. Exemplary copper precursors include metalorganic and organometallic copper precursors. In some embodiments, the copper precursor does not include a halide.

In some embodiments, the copper precursor is selected from copper amidinates, or beta-diketonates, such as bis (acetylacetonate)copper(II), bis(1,1,1,5,5,5-hexafluoro-acetylacetonate)copper(II) and bis(2,2,6,6-tetramethyl-3,5-heptanedionato)copper(II), as well as derivatives thereof.

In some embodiments, the copper precursor is selected from copper betadiketonate compounds, copper betadiketiminato compounds, and/or copper aminoalkoxide compounds, such as Cu(dmae)$_2$, Cu(deap)$_2$, Cu(dmap)$_2$ or Cu(dmamb)$_2$, copper amidinate compounds, such as Cu(sBu-amd)$_2$, copper cyclopentadienyl compounds, copper carbonyl compounds and combinations thereof. In some embodiments, Cu(acac)$_2$ Cu(hfac)$_2$ or Cu(thd)$_2$ compounds are used, such as Cu(acac)L, Cu(hfac)L Cu(thd)L adduct compounds where L is a neutral ligand, such as a neutral adduct ligand, or an alkene or an alkyne.

In some embodiments, a copper precursors comprises a beta-diketiminate or an N-heterocyclic carbene. In some cases, the copper precursor includes one or more of [Cu (HMDS)]$_4$ or Cu(nhc)HMDS (1,3-di-isopropyl-imidazolin-2-ylidene copper hexamethyl disilazide) or Cu-betadiketiminates, such as Cu(dki)VTMS (dki=diketiminate).

In some cases, the copper precursor can include one or more compounds, each compound comprising one or more (e.g., two) Cu atoms plus two or more ligands selected from the group consisting of: dmap, dmamp, dmamb, acac, hfac, thd, Cp, amidinate (e.g., tBu$_2$AMD, tBu$_2$FMD, iPr$_2$AMD, iPr$_2$FMD, sBu$_2$AMD, sBu$_2$FMD), carboxylate (e.g., acetate, pivalate), amidate, trialkylphosphine (e.g., PEt$_3$, PBu$_3$), allyls, NHC compounds (e.g., (iPr$_2$NHC), N(SiMe$_3$)$_2$ and PR$_3$, wherein i stands for iso, t stands for tert and s stands for sec, Me stands for methyl, Et stands for ethyl, Pr stands for propyl, Bu stands for butyl, FMD stands for formamidinate, AMD stands for acetamidinate, dmap stands for dimethylamino-2-propoxide, dmamp stands for dimethylamino-2methyl-2butoxy, dmamb stands for dimethylamino-2methyl-2butoxy, acac stands for acetylacetonate, hfac stands for hexafluoroacetylacetonate, thd stands for 2,2,6,6-tetramethyl-3,5-heptanedionate, Cp stands for cyclopentadienyl, VTMS stands for vinyltrimethylsilane, NHC stands for N-heterocyclic carbene, iPr$_2$FMD is an N,N'-diisopropylformamidinato ligand, iPr$_2$AMD is an N,N'-diisopropylacetamidinato ligand, tBu$_2$FMD is an N,N'-di-tert-butylformamidinato ligand, and tBu$_2$AMD is an N,N'-di-tert-butylacetamidinato ligand, sBuAMD is an N,N'-di-sec-butylacetamidinato, and sBuFMD is an N,N'-di-sec-butylformamidinate.

By way of particular examples, the copper precursor comprises one or more of Cu(dmap)$_2$, Cu(hfac)$_2$, [bis(SiMe$_3$)acetylene](hfac)-copper(I), CuCl$_2$(TMEDA), and Cu[acac]$_2$. However, unless otherwise noted, the invention is not limited to such copper precursors.

A flowrate of the copper precursor to the reaction chamber can vary according to process and reactor. In accordance with examples of the disclosure, the flowrate of the copper precursor is between about 75 and about 1,000 sccm, or between about 100 and about 800 sccm.

During step 106, a reducing agent is provided to the rection chamber. A temperature and pressure within the reaction chamber during step 106 can be as noted above. A flowrate of the reducing agent to the reaction chamber can vary. In accordance with examples of the disclosure, the flowrate of the reducing agent is between about 75 and about 1,000 sccm or between about 100 and about 8000 sccm.

Suitable reducing agents can reduce species on a surface of the substrate after step 104—e.g., to copper metal. Exemplary reducing agents can be selected from one or more of: diethylzinc (DEZ), dimethylzinc (DMZ), trimethylaluminum (TMA), triethylaluminum (TEA), hydrogen (H$_2$), ammonia (NH$_3$), a mixture of ammonia and hydrogen (e.g., about 1 to about 99 vol % hydrogen), alane, compounds comprising an alane adduct, diborane and borane adducts, a silane (e.g., an Si1-Si6 silane), alkyltin (e.g., SnMe$_4$, SnEt$_4$, SnBu$_4$, Sn(vinyl)Bu$_3$), and an alkyltin hydride (e.g., SnBu$_3$H, SnMe$_3$H or SnEt$_3$H), hydrazine, t-butylhydrazine and 1,1-dimethylhydrazine.

In some cases, the reducing agent can provide a dopant to the copper iodide layer. In these cases, the reducing agent can include one or more of Sn, Zn, and Co and one or more of the reducing agent functional groups (e.g., alkyl group, alane adduct, or the like) or co-reactants (e.g., H$_2$) noted above.

During step 108, an iodine reactant is provided to the reaction chamber. A temperature and pressure within the reaction chamber during step 108 can be as noted above. A flowrate of the iodine reactant to the reaction chamber can vary. In accordance with examples of the disclosure, the flowrate of the iodine reactant is between about 75 and about 1,000 sccm or between about 100 and about 8000 sccm.

As noted above, in accordance with examples of the disclosure, the iodine reactant can react with reduced material (e.g., formed during step 106) on a surface of the substrate to form copper iodide. In some embodiments, the iodine reactant is an organic iodine compound. In some embodiments, the iodine reactant is selected from a group consisting of alkyl iodides, aryl iodides, diiodide molecules, hydrogen iodide molecules, acyl iodides, iodosilanes, thionyl iodides, phosphorus-iodine bond-containing molecules and nitrogen-iodine bond-containing molecules.

In some embodiments, the iodine reactant is an alkyl iodide, such as represented by the formula RI, wherein R is an alkyl, for example a C1 to C8, or a C1 to C4 alkyl, such as tert-butyl. In some embodiments, the iodine reactant is an alkyl diiodide. In some embodiments, the iodoalkyl is selected from a group consisting of 1,1-diiodoalkanes, and 1,2-diiodoalkanes. In some embodiments, the iodine reactant is an aryl iodide. In some embodiments, the aryl iodide is iodobenzene. An aryl iodide according to the current disclosure may comprise one, two, three, four, five, or six iodine atoms. In some embodiments, the aryl iodide comprises one iodine atom. An exemplary aryl iodide includes iodobenzene. In some embodiments, the aryl iodide comprises two iodine atoms. An exemplary aryl diiodide includes diiodobenzene and iodotoluene.

In some embodiments, the iodine reactant is I$_2$. In some embodiments, the iodine reactant is HI. In some embodiments, the iodine reactant comprises a C—I bond. In some embodiments, the iodine reactant is an acyl iodide, oxalyl iodide. In some embodiments, the iodine reactant is a diacyl iodide, including bifunctional acyl iodides, i.e. diacid iodides, such as oxalyl iodide and malonyl iodide.

In some embodiments, the iodine reactant is a iodosilane, such as a monoiodosilane, diiodosilane or a triiodosilane. In some embodiments, a iodosilane comprises one iodine atom. In some embodiments, a iodosilane comprises two iodine atoms. In some embodiments, a halosilane comprises three iodine atoms. Exemplary iodosilanes include SiH$_3$I, SiHI$_3$, SiH$_2$I$_2$. The iodine reactant may be silicon iodide (e.g., silicon tetraiodide (SiI$_4$)), an alkylsilyl iodide (e.g., trimethylsilyl iodide (SiMe$_3$I).

In some embodiments, the iodine reactant comprises a S—I bond. In some embodiments, the iodine reactant comprises a thionyl iodide. In some embodiments, the iodine reactant comprises molecules comprising a phosphorus-iodine bond. An example of such molecules is POI$_3$. In some embodiments, the iodine reactant comprises molecules comprising a nitrogen-iodide bond. Examples of such molecules include N-iodosuccinimide.

In some embodiments, the iodine reactant comprises an O—I bond. In some embodiments, the iodine reactant is an alkyl hypoiodite, for example tert-butyl hypoiodite.

Further, in some embodiments, the iodine reactant is a volatile iodine salt, such as ammonium iodide, or pyridinium iodide.

In accordance with these examples, the iodine reactant can be or include one or more metal iodides, such as tin tetraiodide (SnI$_4$), zinc iodide (ZnI$_2$), aluminum triiodide (AlI$_3$)), titanium tetraiodide (TiI4), or the like. In some cases, the iodine reactant can include a dopant, such as one or more of Sn, Zn, and Co.

By way of specific examples, the iodine reactant can be selected from one or more of iodine (I$_2$), diiodomethane, 1,2-diiodoethane, iodobenzene, iodotoluene, tin tetraiodide (SnI$_4$), zinc iodide (ZnI$_2$), aluminum triiodide (AlI$_3$), N-iodosuccinimide, hydrogen iodide (HI), iodosilane (SiH$_3$I), diiodosilane (SiH$_2$I$_2$), triiodosilane (SiHI$_3$), silicon tetraiodide (SiI$_4$), trimethylsilyl iodide and (SiMe$_3$I).

As noted above, in some cases, a dopant reactant can be provided to the reaction chamber—either in a separate cycle or co-flowed with another reactant, such as the reducing agent and/or the iodine reactant for at least a period of time, such that the flow of the two reactants overlap for at least a period of time. As noted above, in some cases, the reducing agent and/or the iodine reactant can additionally or alternatively include a dopant.

When provided as a separate reactant, the dopant reactant can include a suitable reactant that includes one or more of Sn, Zn, and Co. By way of examples, the dopant reactant can be or include one or more of zinc iodide (ZnI$_2$), zinc metal, ZnMe$_2$, ZnEt$_2$, ZnCl$_2$, Zn(DMP)$_2$, Zn(thd)$_2$, Zn(OAc)$_2$, CoI$_2$, Co(DAD)$_2$, cobalt halide with bidentate neutral ligand, such as CoCl$_2$TMEDA or CoCl$_2$TEDA, CCTBA, Co(btsa)$_2$, SnHBu$_3$, Sn(acac)$_2$, Sn(acac)I, SnI$_4$, Co[CO]$_4$TMS, and CoI$_2$(TMEDA), where DAD stands for diazadiene, TMEDA stands for N,N,N',N'-tetramethyl-1,2-ethylenediamine, TEDA stands for triethylenediamine, CCTBA stands for (3,3-Dimethyl-1-butyne)dicobalt hexacarbonyl, btsa stands for bis(trimethylsilyl)amido, TMS stands for trimethylsilyl.

While various combinations of copper precursors, reducing agents, and dopant reactants are suitable, below are specific examples of suitable combinations. These examples are meant to be illustrative, and unless otherwise noted, are not meant to be limiting.

Cu(dmap)$_2$+ZnEt$_2$+1,2-diiodoethane→CuI or Zn:CuI

Cu(dmap)$_2$+ZnEt$_2$+SnI$_4$→CuI or Zn:CuI or Sn:CuI

Cu(hfac)$_2$+ZnEt$_2$+1,2-diiodoethane→CuI or Zn:CuI

Cu(hfac)$_2$+ZnEt$_2$+SnI$_4$→CuI or Zn:CuI or Sn:CuI

Figure 2:
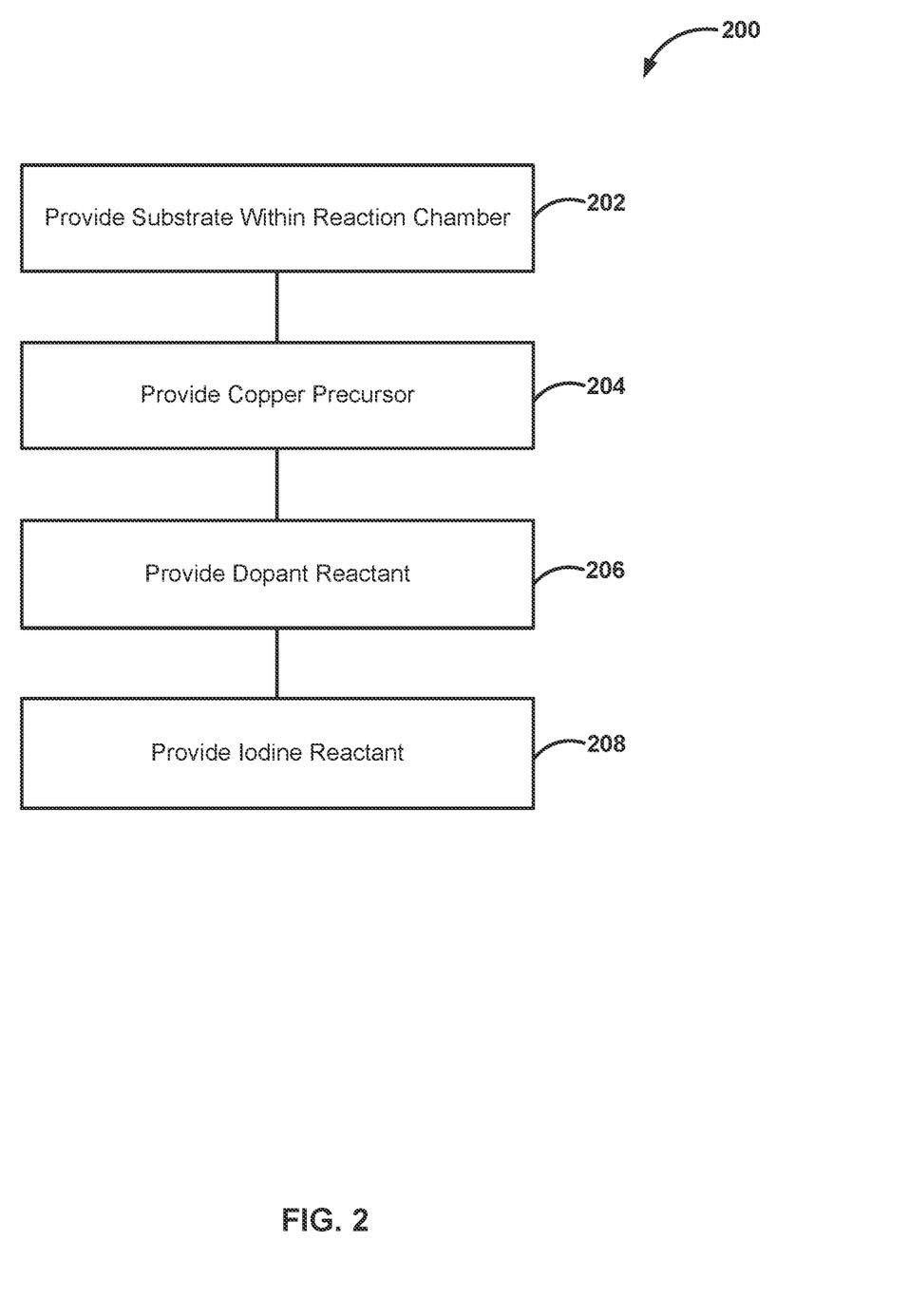
FIG. 2 illustrates another method in accordance with examples of the disclosure.

CuCl$_2$(TMEDA)+H$_2$/NH$_3$→CuClx (step 304)-CuClx surface+AlI$_3$/HI (step 306)→CuI FIG. 2 illustrates another method 200 in accordance with examples of the disclosure. Method 200 includes the steps of providing a substrate within a reaction chamber (step 202); providing a copper precursor to the reaction chamber (step 204); providing a dopant reactant to the reaction chamber (step 206); and providing an iodine reactant to the reaction chamber (step 208). Method 200 is similar to method 100, except method 200 includes a step of providing a dopant reactant (206) and may not include a step of providing a reducing agent (step 106). Similar to method 100, in some cases, steps of method 200 can be combined or can overlap. Method 200 can be a cyclic—e.g., ALD or cyclical CVD method or hybrid cyclical CVD process.

Steps 202, 204, and 208 can be the same or similar to corresponding steps 102, 104, and 108 described above. The reaction chamber temperatures, pressures, reactant and precursor flowrates, reactants, and precursors can be as noted above.

The iodine reactant used during step 208 can be an iodine reactant described above in connection with step 108. In some cases, the iodine reactant for method 200 is selected from one or more reactants selected from the group consisting of I$_2$, HI, a metal iodide, a diiodo compound, a C1-C4 alkyl iodine compound, C1-C8 iodoalkanes, and nitrogen iodide—e.g., as described above.

Step 206 includes providing a dopant reactant, such as a dopant reactant described above, to the reaction chamber. As noted above in connection with method 100, a step of providing a dopant reactant can include providing a reactant that includes one or more of Sn, Zn, and Co. Further, as noted above, the step of providing the dopant reactant can overlap with one or more of providing the iodine reactant (and/or a reducing agent, if one is provided).

Particular examples according to method 200 include:

CuClx surface+SnI$_4$/ZnI/DEZ→Sn:CuI

Sn[acac]$_2$ cyclic[Cu[acac]$_2$+above reducing agents], in any pulsing scheme

Cu(dmap)$_2$+2-iodo propane/tBu-I(RI)→Cu or CuI+ hydroquinone→Cu+p quinone+HI

Figure 3:
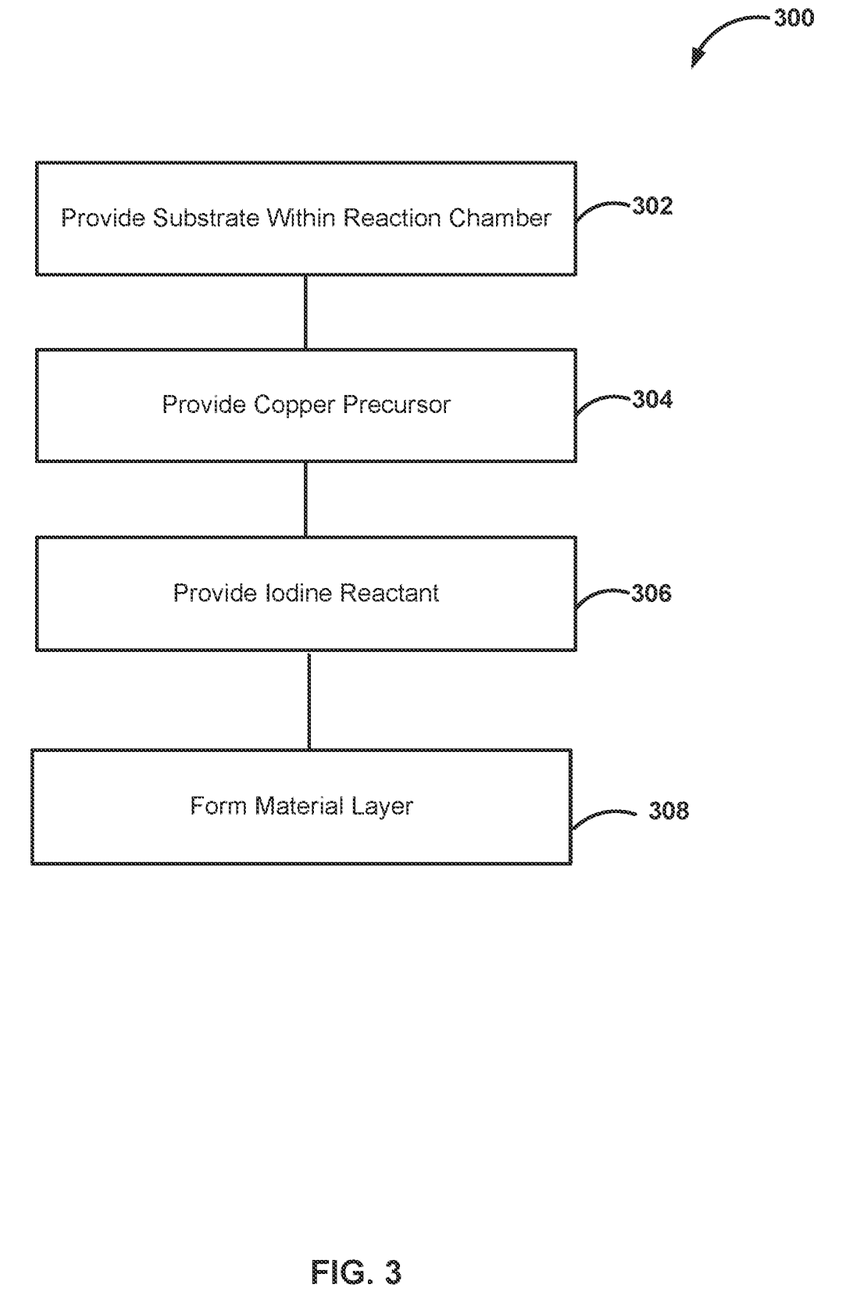
FIG. 3 illustrates yet another method in accordance with examples of the disclosure.

FIG. 3 illustrates another exemplary method 300 of forming a structure comprising a copper iodide layer. Method 300 includes the steps of providing a substrate within a reaction chamber (302), providing a copper precursor to the reaction chamber (304), providing an iodine reactant to the reaction chamber to form the copper iodide layer (306), and forming a material layer overlying the copper iodide layer (308). Method 300 can be similar to method 100 or method 200, except method 300 can include forming a copper iodide layer by providing the copper precursor to the reaction chamber (304) and providing an iodine reactant to the reaction chamber to thereby form the copper iodide layer (306). And, method 300 includes an additional step 308 of forming a material layer overlying the copper iodide layer. Method 300 can be a cyclic—e.g., ALD or cyclical CVD method or hybrid cyclical CVD process.

Steps 302 and 304 can be the same or similar to steps 102 and 104 described above.

Step 306 can be similar to step 108, except the iodine reactant may differ in some cases. For example, the iodine reactant for step 306 may be selected from the group consisting of a diiodo compound, such as diiodoalkane, including 1,2-diiodoalkanes and 1,1-diiodoalkanes and a C1-C10 hydrocarbon bearing one iodo substituent, a C1-C4 alkyl iodine compound, C1-C8 iodoalkanes, and nitrogen iodide. In some embodiments, the iodine reactant comprises a C1-C6 1,1-diiodo substituted hydrocarbon, a C2-C6 1,2-diiodo substituted hydrocarbon, such as diiodomethane. In some embodiments, the iodine reactant comprises 2-iodotoluene. Examples of such compounds are described above. For example, the iodine reactant can be one or more reactants selected from the group consisting of: diiodomethane, 1,2-diiodoethane, iodobenzene, iodotoluene, N-iodosuccinimide, trimethylsilyl iodide (SiMe$_3$I), and nitrogen iodide (NI$_3$). In other cases, other iodine reactants, such as those noted above, can be used.

In some cases, method 300 can include a step of providing a reducing agent to the reaction chamber. In these cases, the reducing agent can be a reducing agent as noted above and the conditions for providing the reducing agent can be as noted above.

Additionally or alternatively, method 300 can include a step of providing a dopant reactant to the reaction chamber. In these cases, the dopant can be a dopant reactant as noted above and the conditions for providing the dopant reactant can be as noted above.

Step 308 includes forming a material layer overlying the copper iodide layer. The material layer can be or include, for example, a metal, metal nitride, such as titanium nitride, a dielectric, such as a high k dielectric (HfO$_2$). The material layer can be deposited using, for example, a cyclical process, such as ALD or the like. Step 308 can be performed within the same reactor system as steps 302-304.

A particular example according to method 300 includes:

Methods 100-300 may not require an additional anneal step after the formation of the copper iodide layer.

Methods described herein are suitable for use in forming a variety of structures and devices, including, for example, memory (e.g., DRAM) structures and devices.

Figure 4:
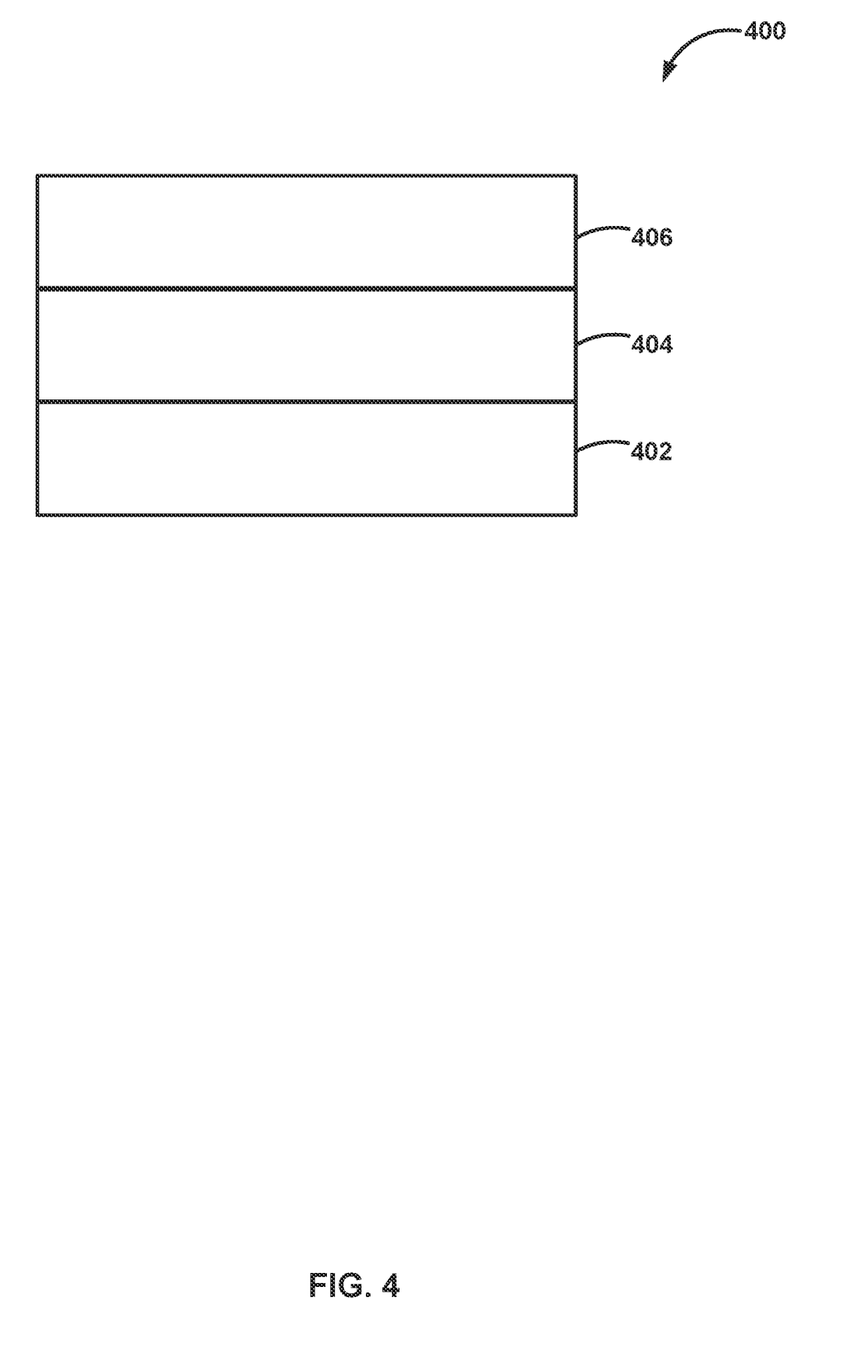
FIG. 4 illustrates a structure in accordance with examples of the disclosure.

FIG. 4 illustrates a structure 400 in accordance with examples of the disclosure. Structure 400 includes a substrate 402, a copper iodide layer 404 formed overlying the substrate, and a material layer 406 overlying (e.g., and in contact with) copper iodide layer 404. Structure 400 can form part of a device, such as a memory (e.g., DRAM) device. In some cases, structure 400 can be used in the formation of CMOS or analog/digital devices.

Substrate 402 can be or include a substrate as described herein.

Copper iodide layer 404 can be a copper iodide layer formed according to a method described herein. Copper iodide layer 404 can include one or more dopants, such as one or more of Sn, Zn, and Co. A concentration of the one or more dopants (collectively or individually) can be from about 0.1 to about 10 or about 0.5 to about 6 at %.

A bandgap of the copper iodide layer 404 can be greater than 2.8 eV or 3.0 eV or be between about 2.8 eV and about 3.5 eV. A transparency of the copper iodide layer in the visible light spectrum can be greater than 45% or 50% or be between about 50% and 100%. Copper iodide layer 404 can form a p-type semiconducting layer—similar to a p-type metal oxide layer, but with high stability and more desirable bandgap and/or transparency and/or higher carrier mobility.

Figure 5:
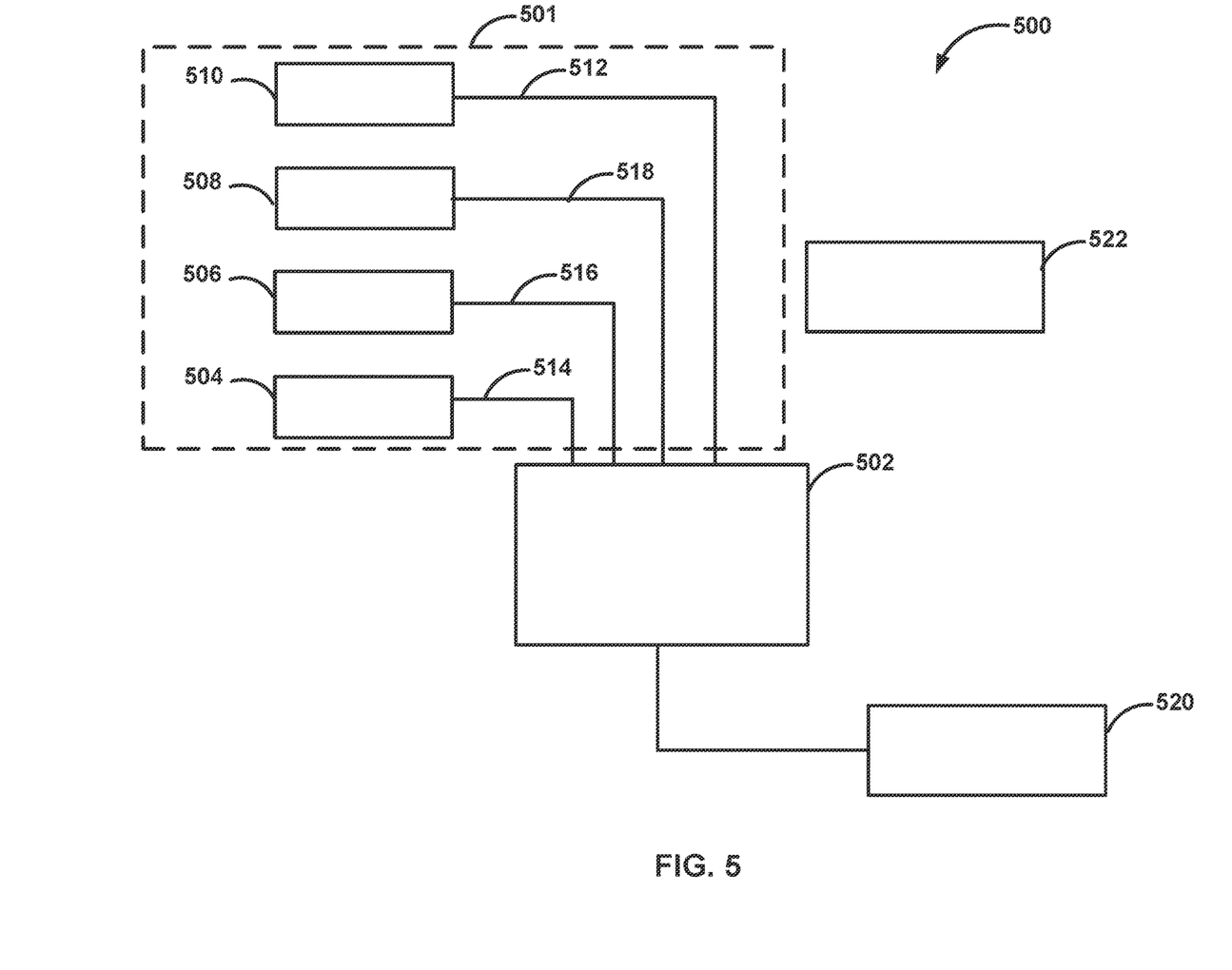
FIG. 5 illustrates a reactor system in accordance with examples of the disclosure.

FIG. 5 illustrates a reactor system 500 according to additional embodiments of the disclosure. Reactor system 500 can be used to perform a method as described herein and/or to form a structure or a device, or a portion thereof as described herein.

In the illustrated example, reactor system 500 includes one or more reaction chambers 502, a precursor injector system 501, a copper precursor source 504, an iodine reactant source 506, a reducing reactant source 508, a dopant reactant source 510, an exhaust source 520, and a controller 522. Reactor system 500 may comprise one or more additional gas sources (not shown), such as an inert gas source, a carrier gas source and/or a purge gas source.

Reaction chamber(s) 502 can include any suitable reaction chamber, such as an ALD or CVD reaction chamber.

Copper precursor source 504 can include a vessel and one or more copper precursors as described herein—alone or mixed with one or more carrier (e.g., inert) gases. Iodine reactant source 506 can include a vessel and one or more iodine reactants as described herein—alone or mixed with one or more carrier gases. Reducing reactant source 508 can include a vessel and one or more reducing agents as described herein—alone or mixed with one or more carrier gases. Dopant reactant source 510 can include a vessel and one or more dopant reactants as described herein—alone or mixed with one or more carrier gases.

Exhaust source 520 can include one or more vacuum pumps.

Controller 522 includes electronic circuitry and software to selectively operate valves, manifolds, heaters, pumps and other components included in the reactor system 500. Such circuitry and components operate to introduce precursors, reactants and purge gases from the respective sources 504-510. Controller 522 can control timing of gas pulse sequences, temperature of the substrate and/or reaction chamber 502, pressure within the reaction chamber 502, and various other operations to provide proper operation of reactor system 500. Controller 522 can include control software to electrically or pneumatically control valves (e.g., along lines 512-518) to control flow of precursors, reactants and purge gases into and out of reaction chamber 502. Controller 522 can include modules, such as a software or hardware component, which perform certain tasks. A module may be configured to reside on the addressable storage medium of the control system and be configured to execute one or more processes.

Other configurations of reactor system 500 are possible, including different numbers and kinds of precursor and reactant sources. Further, it will be appreciated that there are many arrangements of valves, conduits, precursor sources, and auxiliary reactant sources that may be used to accomplish the goal of selectively and in a coordinated manner feeding gases into reaction chamber 502. Further, as a schematic representation of a reactor system, many components have been omitted for simplicity of illustration, and such components may include, for example, various valves, manifolds, purifiers, heaters, containers, vents, and/or bypasses.

Although illustrated with four source vessels 504-510, reactor system 500 can include any suitable number of source vessels. Sources 504-510 can be coupled to reaction chamber 502 via lines 512-518, which can each include flow controllers, valves, heaters, and the like.

During operation of reactor 500, substrates, such as semiconductor wafers (not illustrated), are transferred from, e.g., a substrate handling system to reaction chamber 502. Once substrate(s) are transferred to reaction chamber 502, one or more gases from gas sources, such as precursors, reactants, carrier gases, and/or purge gases, are introduced into reaction chamber 502.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of forming a copper iodide layer on a surface of a substrate, the method comprising the steps of:
   providing a substrate within a reaction chamber;
   providing a copper precursor to the reaction chamber;
   providing a reducing agent to the reaction chamber;
   providing an iodine reactant to the reaction chamber; and
   providing a dopant reactant to the reaction chamber.

2. The method of claim 1, wherein the iodine reactant comprises one or more reactants selected from a group consisting of alkyl iodides, aryl iodides, diiodide molecules, hydrogen iodide molecules, acyl iodides, iodosilanes, thionyl iodides, phosphorus-iodine bond-containing molecules, carbon-iodine bond-containing molecules, oxygen-iodine bond-containing molecules, nitrogen-iodine bond-containing molecules, a volatile iodine salt, and a metal iodide.

3. The method of claim 1, wherein the iodine reactant comprises one or more reactants selected from the group consisting of: iodine ($I_2$), diiodomethane, 1,2-diiodoethane, iodobenzene, iodotoluene, tin tetraiodide ($SnI_4$), zinc iodide ($ZnI_2$), aluminum triiodide ($AlI_3$), titanium iodide ($TiI_4$), N-iodosuccinimide, hydrogen iodide (HI), iodosilane ($SiH_3I$), diiodosilane ($SiH_2I_2$), triiodosilane ($SiHI_3$), silicon tetraiodide ($SiI_4$), and trimethylsilyl iodide ($SiMe_3I$).

4. The method of claim 1, wherein the dopant reactant comprises one or more of Sn, Zn, and Co.

5. The method of claim 1, wherein the step of providing the dopant reactant and the step of providing the iodine reactant overlap.

6. The method of any of claim 1, wherein the copper precursor comprises one or more compounds, each compound comprising one or more Cu atoms plus two or more ligands selected from the group consisting of: dmap, dmamp, dmamb, acac, hfac, thd, Cp, amidinate, carboxylate, amidate, trialkylphosphine, allyls, NHC compounds and $PR_3$.

7. The method of claim 1, wherein the copper precursor comprises one or more of $Cu(dmap)_2$, $Cu(hfac)_2$, [bis(SiMe$_3$)acetylene](hfac)-copper (I), $CuCl_2$(TMEDA), Cu[a-cac]$_2$, [Cu(iPrAMD)]$_2$, [Cu(sBuAMD)]$_2$, $Cu(dmamb)_2$, $Cu(OAc)_2$, $Cu(O_2CtBu)_2$, $CuCp(PEt_3)$, $Cu(PBu_3)_2(acac)$, and Cu(dki)VTMS.

8. The method of claim 1, wherein the reducing agent is selected from one or more of: diethylzinc (DEZ), dimethylzinc (DMZ), trimethylaluminum (TMA), triethylaluminum (TEA), hydrogen ($H_2$), ammonia ($NH_3$), a mixture of ammonia and hydrogen, alane, compounds comprising an alane adduct, diborane and borane adducts, a silane, an alkyltin an alkyltin hydride, hydrazine, t-butylhydrazine, and 1,1-dimethylhydrazine.

9. A method of forming a doped copper iodide layer on a surface of a substrate, the method comprising the steps of:
providing a substrate within a reaction chamber;
providing a copper precursor to the reaction chamber;
providing a dopant reactant to the reaction chamber; and
providing an iodine reactant to the reaction chamber,
wherein the dopant reactant comprises one or more of: zinc iodide ($ZnI_2$), zinc metal, $ZnMe_2$, $ZnEt_2$, $ZnCl_2$, $Zn(DMP)_2$, $Zn(thd)_2$, $Zn(OAc)_2$, $CoI_2$, $Co(DAD)_2$, $CoCl_2$TMEDA, $CoCl_2$TEDA, CCTBA, $Co(btsa)_2$, $SnHBu_3$, $Sn(acac)_2$, Sn(acac)I, $SnI_4$, $Sn_2Bu_3$, Co[CO]$_4$TMS, and $CoI_2$(TMEDA).

10. A method of forming a copper iodide layer on a surface of a substrate, the method comprising the steps of:
providing a substrate within a reaction chamber;
providing a copper precursor to the reaction chamber;
providing a reducing agent to the reaction chamber; and
providing an iodine reactant to the reaction chamber,
wherein the reducing agent comprises a dopant.

11. A method of forming a doped copper iodide layer on a surface of a substrate, the method comprising the steps of:
providing a substrate within a reaction chamber;
providing a copper precursor to the reaction chamber;
providing a dopant reactant to the reaction chamber; and
providing an iodine reactant to the reaction chamber,
wherein the dopant reactant comprises one or more of Sn, Zn, and Co.

12. The method of claim 11, wherein the iodine reactant comprises one or more reactants selected from a group consisting of alkyl iodides, aryl iodides, diiodide molecules, hydrogen iodide molecules, acyl iodides, iodosilanes, thionyl iodides, phosphorus-iodine bond-containing molecules, carbon-iodine bond-containing molecules, oxygen-iodine bond-containing molecules, nitrogen-iodine bond-containing molecules, a volatile iodine salt, and a metal iodide.

13. The method of claim 11, wherein the dopant reactant comprises one or more of Sn, Zn and Co.

14. The method of claim 11, wherein the step of providing the dopant reactant and the step of providing the iodine reactant overlap.

15. A method of forming a structure comprising a copper iodide layer, the method comprising the step of:
providing a substrate within a reaction chamber;
providing a copper precursor to the reaction chamber;
providing an iodine reactant to the reaction chamber to form the copper iodide layer;
forming a material layer overlying the copper iodide layer; and
providing a reducing agent to the reaction chamber,
wherein the iodine reactant comprises one or more reactants selected from a group consisting of alkyl iodides, aryl iodides, diiodide molecules, hydrogen iodide molecules, acyl iodides, iodosilanes, thionyl iodides, phosphorus-iodine bond-containing molecules, carbon-iodine bond-containing molecules, oxygen-iodine bond-containing molecules, nitrogen-iodine bond-containing molecules, a volatile iodine salt, and a metal iodide.

16. The method of claim 15, wherein the iodine reactant comprises one or more reactants selected from the group consisting of: diiodomethane, 1,2-diiodoethane, iodobenzene, iodotoluene, tin tetraiodide ($SnI_4$), zinc iodide ($ZnI_2$), aluminum triiodide ($AlI_3$), titanium iodide ($TiI_4$), N-iodosuccinimide, iodosilane ($SiH_3I$), diiodosilane ($SiH_2I_2$), triiodosilane ($SiHI_3$), silicon tetraiodide ($SiI_4$), and trimethylsilyl iodide ($SiMe_3I$).

17. The method of claim 15, further comprising providing a dopant reactant to the reaction chamber.

18. The method of claim 15, wherein the copper precursor comprises one or more compounds, each compound comprising one or more Cu atoms plus two or more ligands selected from the group consisting of: dmap, dmamp, dmamb, acac, hfac, thd, Cp, amidinate, carboxylate, amidate, trialkylphosphine, allyls, NHC compounds and $PR_3$.

* * * * *